United States Patent [19]

Murata et al.

[11] Patent Number: 5,423,915
[45] Date of Patent: Jun. 13, 1995

[54] PLASMA CVD APPARATUS INCLUDING ROTATING MAGNETIC FIELD GENERATION MEANS

[75] Inventors: Masayoshi Murata; Yoshiaki Takeuchi, both of Nagasaki, Japan

[73] Assignee: Mitsubishi Jukogyo Kagushiki Kaisha, Tokyo, Japan

[21] Appl. No.: 127,377

[22] Filed: Sep. 28, 1993

Related U.S. Application Data

[62] Division of Ser. No. 33,752, Mar. 18, 1993.

[30] Foreign Application Priority Data

Apr. 16, 1992 [JP] Japan ................................. 4-96615
May 6, 1992 [JP] Japan ................................. 4-113336

[51] Int. Cl.$^6$ ............................................. C23C 16/50
[52] U.S. Cl. ............................. 118/723 E; 118/723 R; 118/715
[58] Field of Search ............ 118/723 E, 723 ER, 715; 156/345; 315/111.41; 427/570, 571, 578

[56] References Cited

U.S. PATENT DOCUMENTS

| | | | |
|---|---|---|---|
| 4,740,268 | 4/1988 | Bukham ........................ | 156/345 X |
| 4,829,215 | 5/1989 | Kim et al. ..................... | 315/111.41 |
| 4,842,683 | 6/1989 | Cheng et al. .................. | 156/345 |
| 4,901,669 | 2/1990 | Yamamoto et al. ............ | 118/723 E |
| 5,089,442 | 2/1992 | Olmer ............................ | 437/50 X |

FOREIGN PATENT DOCUMENTS

| | | |
|---|---|---|
| 62-263236 | 11/1987 | Japan . |
| 63-243286 | 10/1988 | Japan . |
| 2-237117 | 9/1990 | Japan . |
| 3-222415 | 10/1991 | Japan . |
| 4-21781 | 1/1992 | Japan . |

OTHER PUBLICATIONS

Proc. of the Int'l Seminar on Reactive Plasmas, 1991, "Status of the GEC RF Reference Cell/Laser Diagnostics etc." Hargis, Jr., et al.
Proc. of the Int'l Seminar on Reactive Plasmas, 1991, "The Helicon Diffusion Reactor" Boswell et al.
Proc. of the Int'l Seminar on Reactive Plasmas, 1991 "A Plasma Source for Processing Using Linear Multipole Field" Fukao et al.
Proc. of the Int'l Seminar on Reactive Plasmas, 1991, "Large Diameter Plasma Sourse" Hagane et al.
Proc. of the Int'l Seminar on Reactive Plasmas, 1991, "Trial Preparation of Uniform Titanium Nitride Thin Films by etc." Kuwahara et al.

*Primary Examiner*—R. Bruce Breneman
*Assistant Examiner*—Jonathan D. Baskin
*Attorney, Agent, or Firm*—Nixon & Vanderhye

[57] ABSTRACT

This invention provides a plasma CVD method aimed at forming an amorphous silicon thin film on a large-area substrate at a high speed and also an apparatus therefor. The method and apparatus are characterized by a reaction vessel, means for feeding a reactant gas to the reaction vessel and discharging the same, discharging electrodes accommodated in the reaction vessel, a source for supplying power for glow discharge to the discharging electrodes, two pairs of solenoid coils arranged on opposite sides of said reaction vessel and so disposed that the axes thereof perpendicularly intersect each other as well as perpendicularly the electric field formed between the discharging electrodes, and an AC source for supplying power to said solenoid coils for magnetic field generation, whereby an amorphous silicon thin film is formed on a substrate held to intersect perpendicularly the electric field between the discharging electrodes.

2 Claims, 15 Drawing Sheets

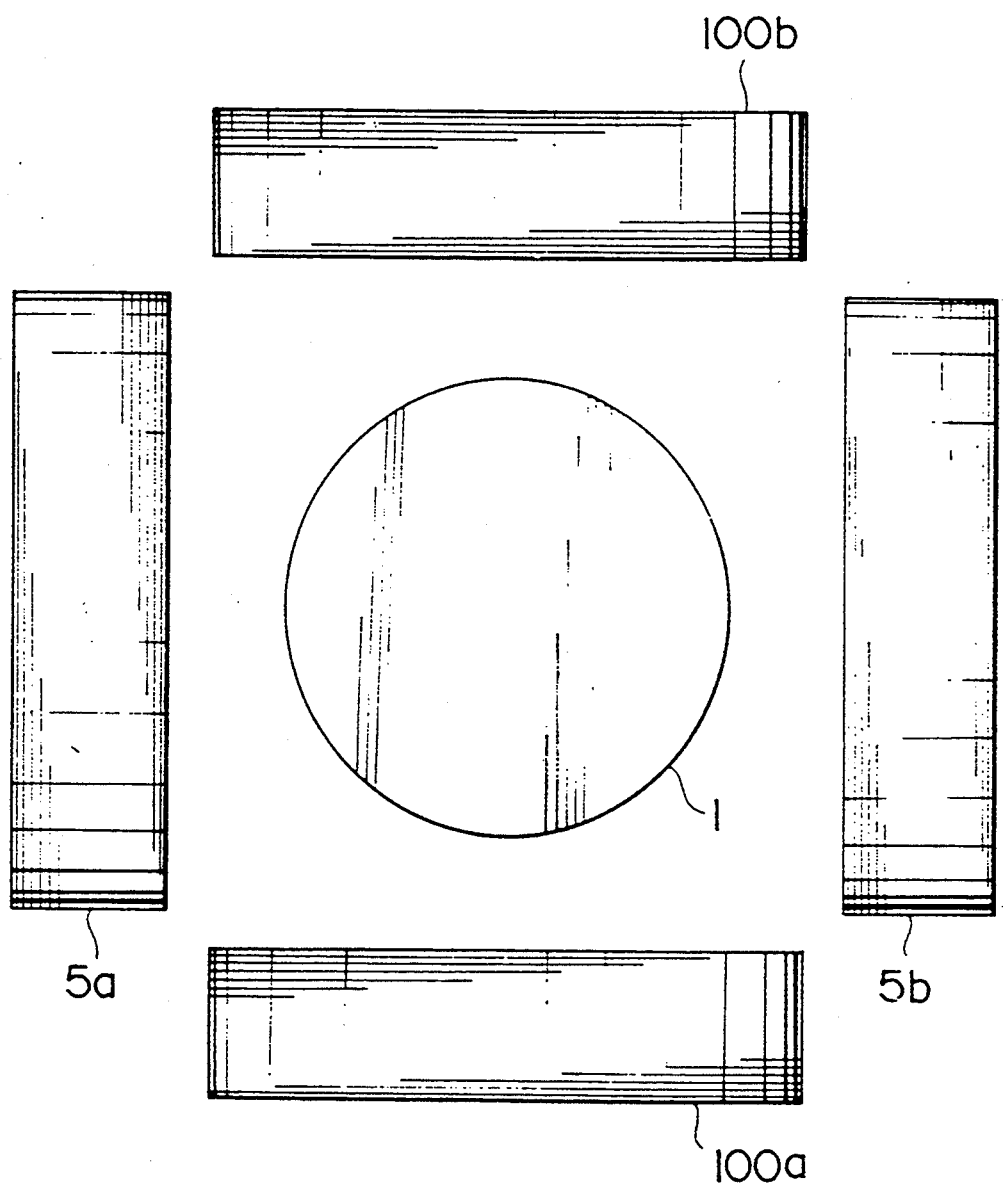

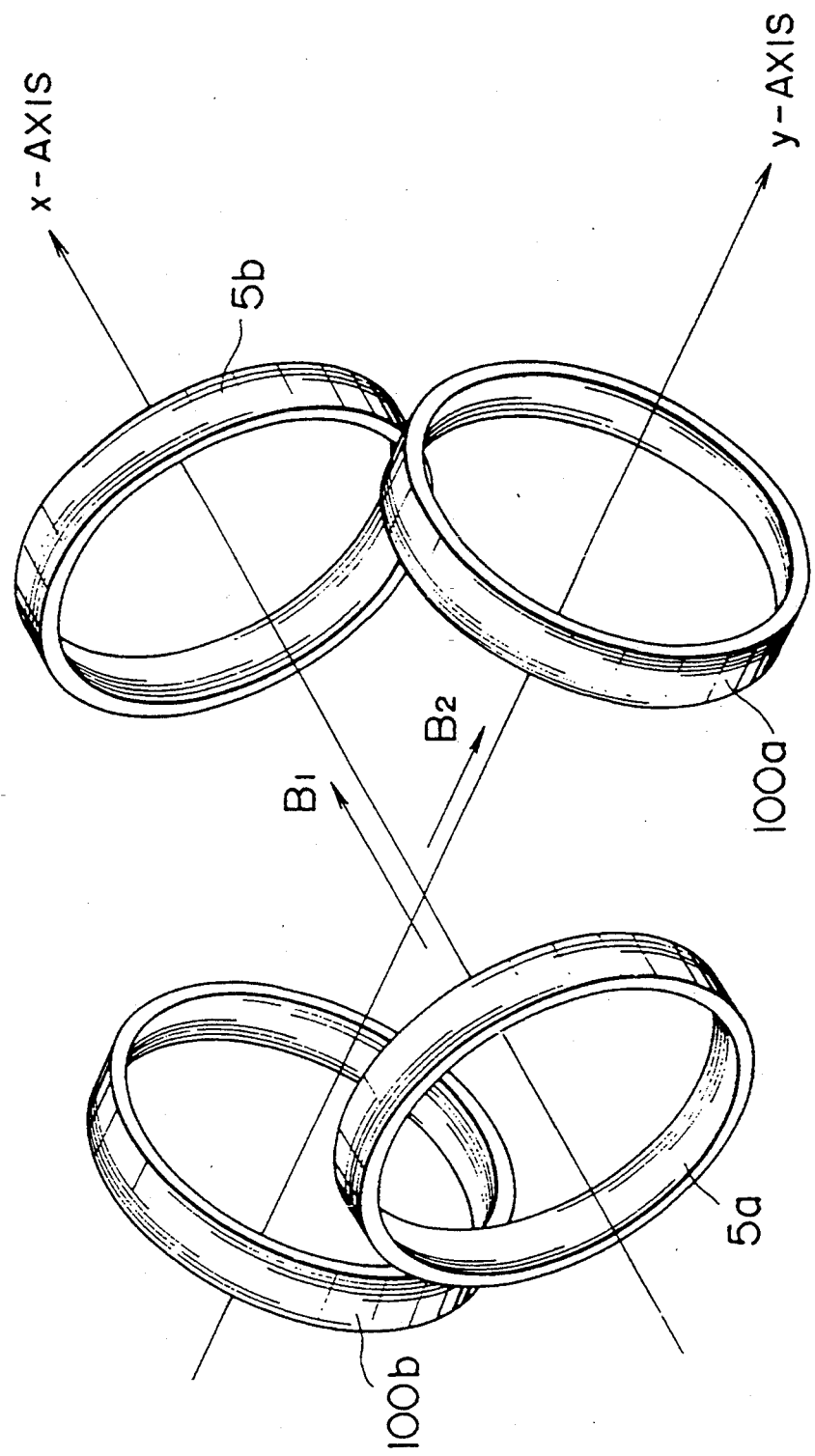

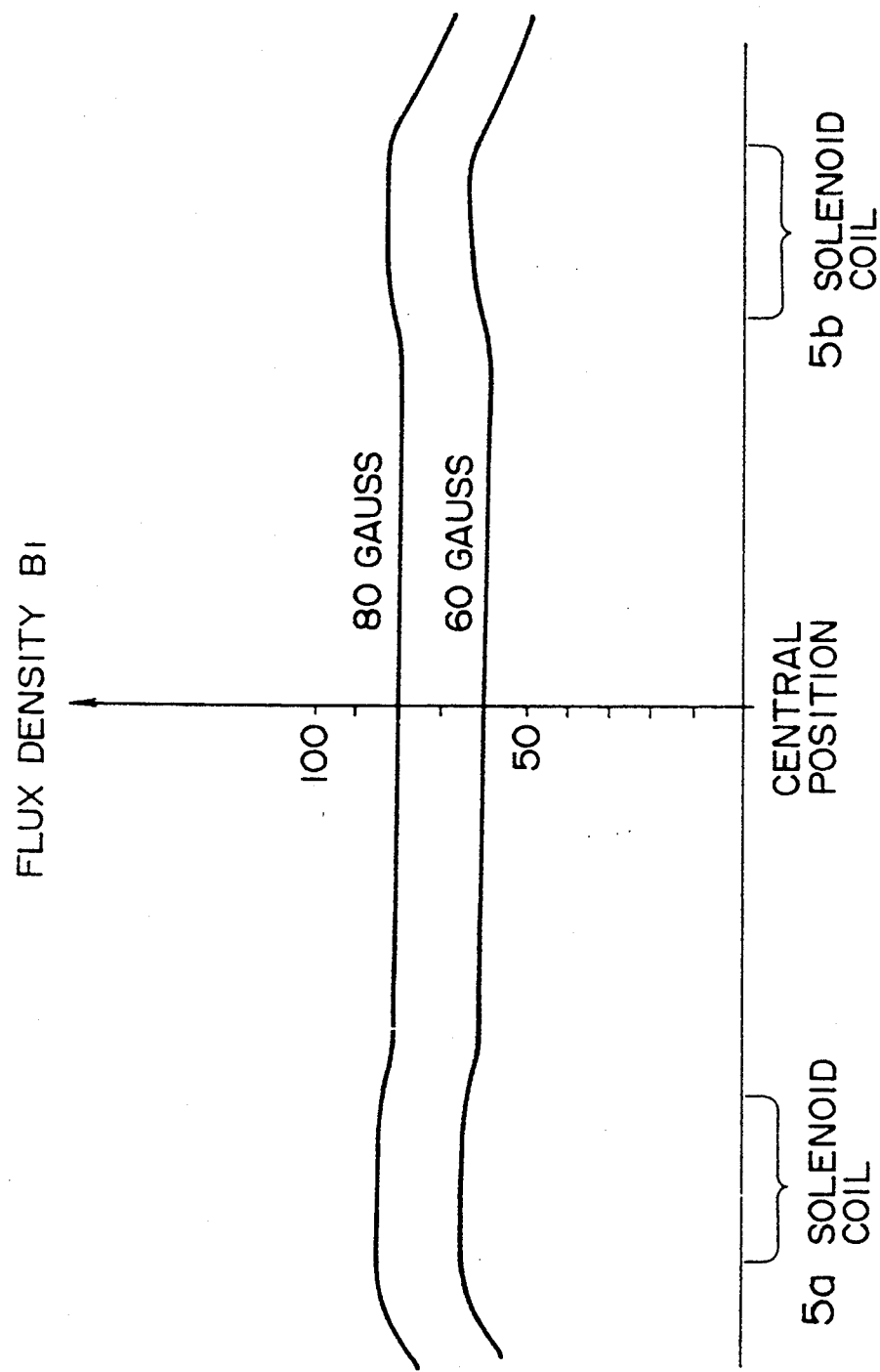

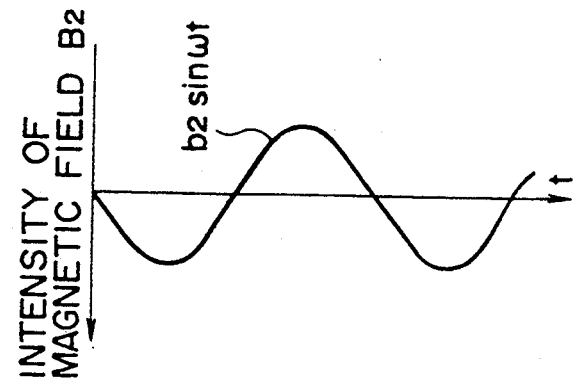
FIG. 5(c) RESULTANT MAGNETIC FIELD OF SOLENOID COILS 100a AND 100b
$b_2$ : AMPLITUDE
$\omega$ : ANGULAR FREQUENCY
$t$ : TIME
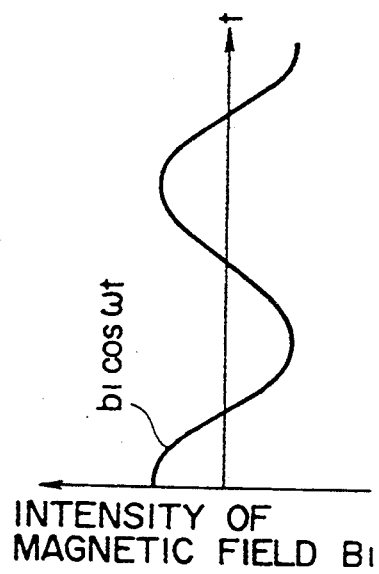
FIG. 5(b) RESULTANT MAGNETIC FIELD OF SOLENOID COILS 5a AND 5b
$b_1$ : AMPLITUDE
$\omega$ : ANGULAR FREQUENCY
$t$ : TIME
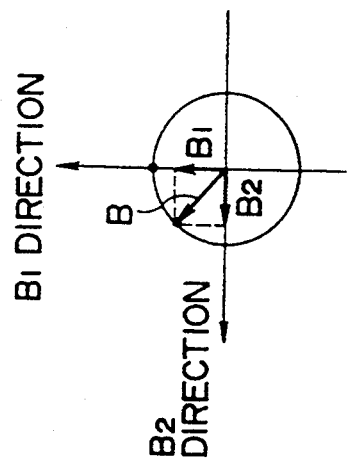
FIG. 5(a) RESULTANT MAGNETIC FIELD F I G. 12
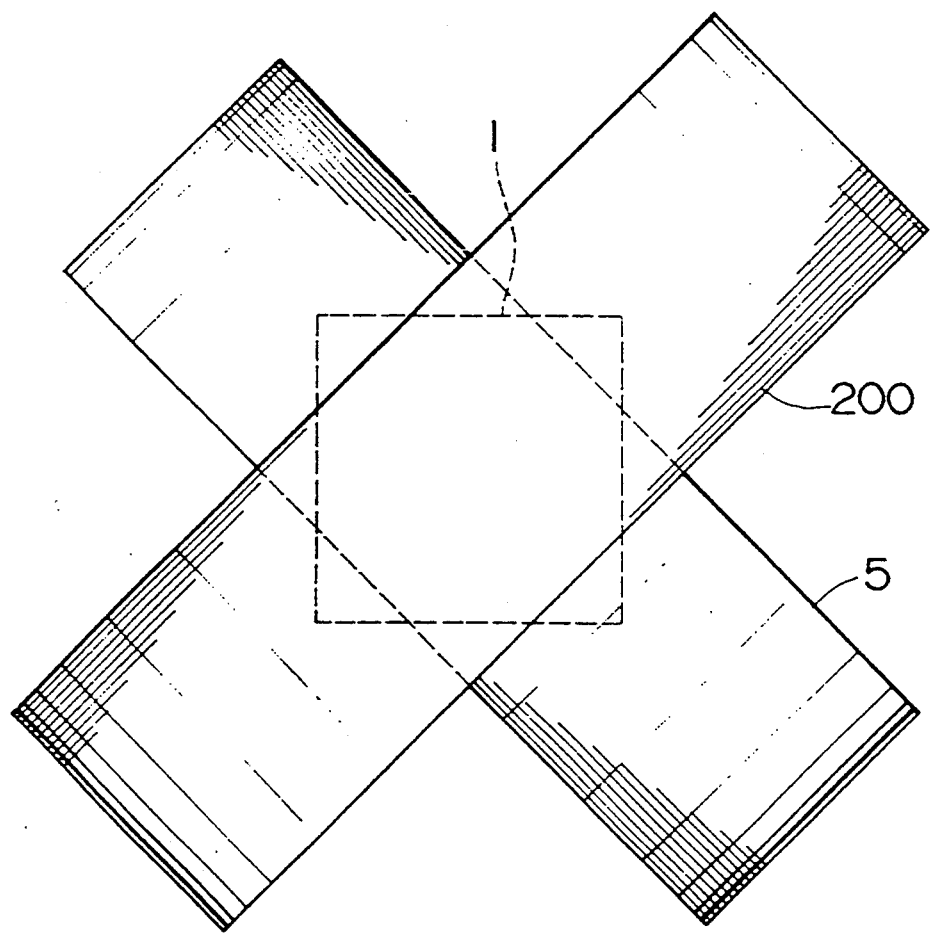

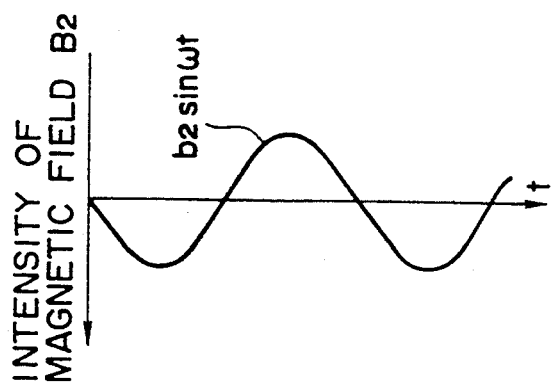
F I G. 13(c) MAGNETIC FIELD OF SECOND SOLENOID COIL
$b_2 \sin \omega t$
$\begin{cases} b_2 : \text{AMPLITUDE} \\ \omega : \text{ANGULAR FREQUENCY} \\ t : \text{TIME} \end{cases}$
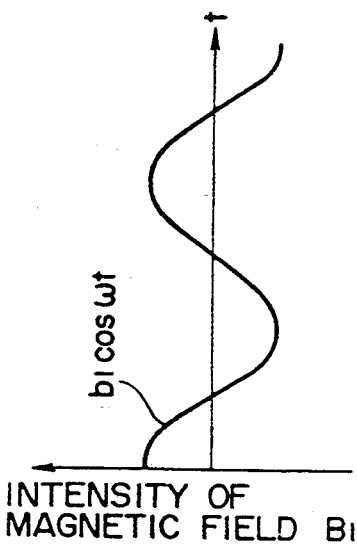
F I G. 13(b) MAGNETIC FIELD OF FIRST SOLENOID COIL
$b_1 \cos \omega t$
$\begin{cases} b_1 : \text{AMPLITUDE} \\ \omega : \text{ANGULAR FREQUENCY} \\ t : \text{TIME} \end{cases}$
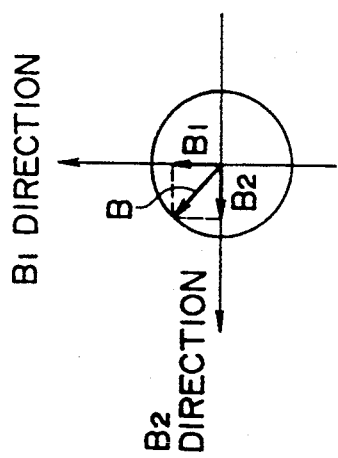
F I G. 13(a) RESULTANT MAGNETIC FIELD

REACTION GAS SUPPLY

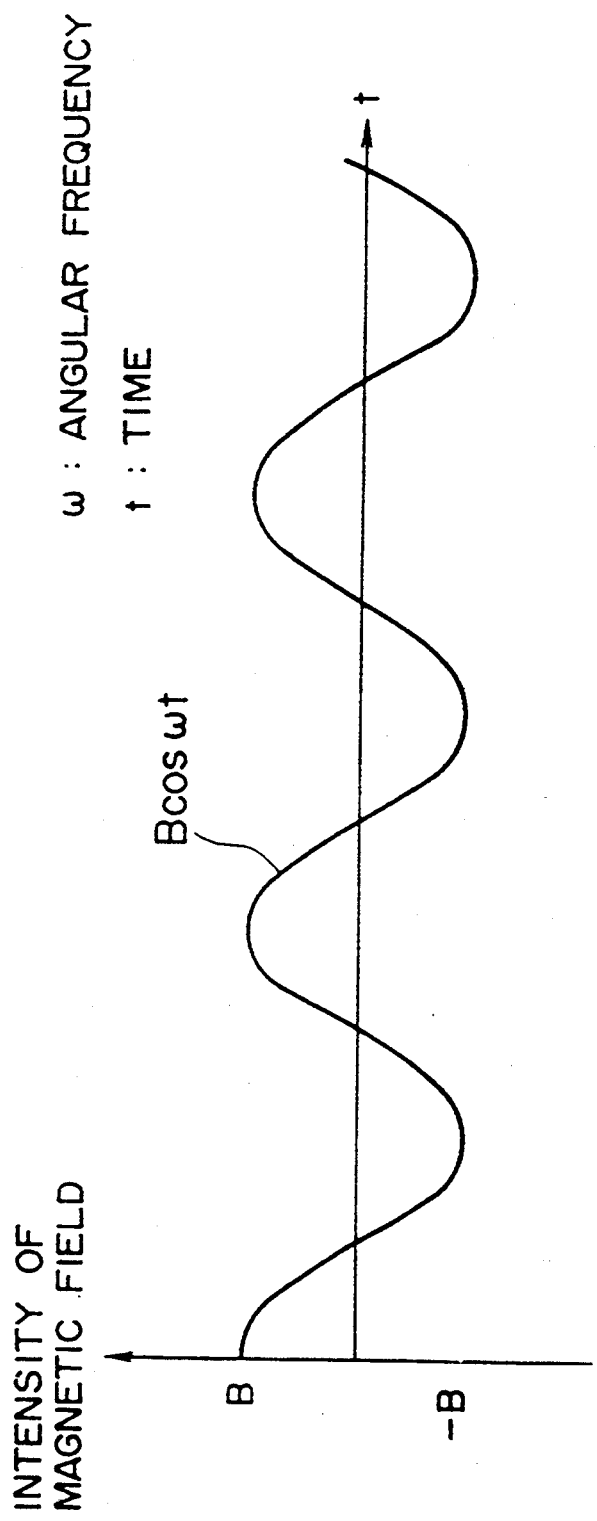

PLASMA CVD APPARATUS INCLUDING ROTATING MAGNETIC FIELD GENERATION MEANS

This is a divisional of application Ser. No. 08/033,752, filed Mar. 18, 1993.

This invention relates to a plasma chemical vapor deposition (CVD) method suited for the production of large-area thin films to be used in various electronic devices, such as amorphous silicon solar batteries, thin film transistors, photosensors, and semiconductor protective films, and relates also to a plasma CVD apparatus therefor.

For the fabrication of large-area thin films of amorphous silicon, plasma CVD apparatuses are used. The construction of a conventional apparatus will now be explained with reference to FIG. 14. This technical means is known in the art as taught, e.g., by Japanese Patent Provisional Publication No. 62-263236 (No. 263236/1987).

Referring to FIG. 14 there are shown a pair of electrodes 2, 3 held apart in parallel to produce a glow discharge plasma within a reaction vessel 1. These electrodes 2, 3 are supplied with power at a commercial frequency, e.g., of 60 Hz, from a low-frequency power source 4. For the power supply, a direct-current or high-frequency source may be used instead. A coil 5 is wound round the reaction vessel 1 to enclose it and is supplied with alternate-current power by an AC source 6. The reaction vessel 1 is fed with a reactant gas, e.g., a mixed gas of monosilane and hydrogen, from a steel cylinder not shown via a reactant gas inlet pipe 7. The gas inside the reaction vessel 1 is evacuated by a vacuum pump 9 through an evacuation (or exhaust) pipe 8. A substrate 10 is held by proper means outside the discharge space formed by the electrodes 2, 3, at right angles to the planes of the electrodes.

A thin film is formed using the illustrated apparatus in the following way. The vacuum pump 9 is driven to evacuate the reaction vessel 1. A mixed gas, e.g., of monosilane and hydrogen, is fed through the reactant gas inlet pipe 7, and a voltage from the low-frequency power source is applied to the electrodes 2, 3 while the pressure inside the reaction vessel 1 is kept between 0.05 and 0.5 Torr. This causes a glow discharge plasma to be formed between the electrodes 2, 3. An AC voltage, e.g., of 10 Hz, is applied to the coil 5 so as to provide a magnetic field B in the direction normal to an electric field E formed between the electrodes 2, 3. Thus, the magnetic field B is formed normal to the discharge electric field E between the electrodes 2, 3 that generates the glow discharge plasma. The intensity of the magnetic field B changes sinusoidally, and therefore the direction changes periodically. The flux density in the magnetic field B may range from about 50 to about 100 gausses.

The mixed gas fed through the reactant gas inlet pipe 7 is decomposed by the glow discharge plasma produced between the electrodes 2, 3. Resulting radicals Si deposit, forming a thin film, on the surface of the substrate 10.

Charged particles such as hydrogen ions begin a so-called E.B drift motion under the urgings of a Coulomb force $F_1 = qE$ and a Lorentz force $F_2 = q(V.B)$ where V is the velocity of the charged particles, due to the electric field E between the electrodes 2, 3. The charged particles, in a state of having been imparted with an initial velocity by the E.B drift, fly in the direction intersecting perpendicularly the electrodes 2, 3, i.e., toward the substrate 10. In a discharge space where the influence of the electric field between the electrodes 2, 3 is slight, the particles fly along a Larmor orbit, as indicated by an arrow, in a cyclotron motion caused by the magnetic field B formed by the coil 5. Consequently, there is but a small possibility of the charged particles such as hydrogen ions directly impinging on the substrate 10.

Radicals Si that are electrically neutral remain unaffected by the magnetic field B. They deviate from the orbit of the charged particle group and reach the substrate 10, forming an amorphous (noncrystalline) thin film on the surface. Since the radicals Si collide with the charged particles travelling along the Larmor orbit, the amorphous thin film is formed not only at the front of the electrodes 2, 3 but also as extended leftwardly or rightwardly. In addition, variation of the magnetic field B by the AC source 6 makes it possible to form the amorphous thin film evenly on the surface of the substrate 10. The electrodes 2, 3 may have as great a length, without any problem, as the reaction vessel 1 warrants. They permit the formation of a uniform amorphous thin film on the surface of a long substrate 10.

With the conventional apparatus described above, a large-area film can be easily formed by producing the magnetic field B in the direction perpendicularly intersecting the discharge electric field E between the electrodes 2, 3 that generates a glow discharge plasma. The apparatus, on the other hand, presents the following problems.

(1) When a large-area film is to be formed, long electrodes must be used. To produce a stable plasma using such long electrodes a power supply at a frequency between several ten and several hundred hertz is used, because the lower the source frequency the easier the plasma generation is. However, as the frequency decreases to such an extent that the distance of ion migration during the half period exceeds the distance between the electrodes, the secondary electrons released from the negative electrode upon ion bombardment substantially bear the responsibility of maintaining the plasma, as is the case with DC discharge. Consequently, once any portion of the electrodes is insulated by film deposition, that portion does no longer discharge. To avoid it, the electrode surface must be kept clean. This involves complexity of maintenance, including frequent replacement of electrodes and incessant cleaning, raising the cost accordingly.

(2) If, in order to make up for the defect (1) above, a source of high frequency, e.g., of 13.56 MHz is employed for the plasma generation, the secondary electrons released from the electrode for discharge maintenance are no longer essential, and glow discharge takes place between the electrodes regardless of the presence of any insulating matter such as a film on the electrodes. However, when long electrodes are used, the skin effect of high frequency causes most current to flow on the surface portions (about 0.01 mm deep) of the electrodes, increasing the electric resistance. For example, electrodes about one meter or longer would no longer produce a uniform plasma due to the emergence of potential distribution on the electrodes. It is represented by a distributed constant circuit as shown in FIG. 15. In the schematic diagram X signifies the distance between electrodes in their longitudinal direction. When the resistance R per unit length of the electrodes has increased appreciably as compared with the impedances of the discharging portions, $Z_1, Z_2, \ldots Z_n$, potential distribution appears in the electrodes. Thus, it has hitherto been very difficult and practically impossible to form a large-area film using a high frequency source.

(3) According to the method described in (1) and (2) above, a modulated magnetic field whose intensity varies sinusoidally as shown in FIG. 16 is applied to the plasma. Compared with the case in which the magnetic field intensity is constant, the effects of increasing the plasma density by the magnetic field and thereby enhancing the film-forming speed are not appreciable. In forming an amorphous silicon film, for example, it has seldom been possible to maintain a film-forming speed of higher than 1 to 2 angstroms per second.

OBJECT AND SUMMARY OF THE INVENTION

The present invention has now been made with the foregoing in view, and its object is to overcome the above-described problems and provide a method and an apparatus for plasma CVD whereby a large-area film can be formed at an enhanced rate.

The structures of the present invention for realizing the above object are as follows:

(1) The plasma CVD method of the invention whereby a substrate is set in a reaction vessel, a reactant gas is fed, and a glow discharge plasma is produced between discharging electrodes to form an amorphous (noncrystalline) thin film on the substrate is characterized in that magnetic fields are applied to intersect perpendicularly an electric field formed between the discharging electrodes and in two directions perpendicularly intersecting each other.

(2) The plasma CVD method of the invention whereby an amorphous (noncrystalline) thin film is formed using a glow discharge plasma is characterized in that a magnetic field is applied which rotates at a constant angular velocity on a plane perpendicularly intersecting an electric field formed between discharging electrodes.

(3) In the method of the invention, in order to rotate the magnetic field at a constant angular velocity, means are used which are, e.g., two solenoid coils disposed so that the magnetic fields they produce perpendicularly intersect each other as well as perpendicularly the electric field that the discharging electrodes form.

(4) The plasma CVD apparatus of the invention is characterized by comprising a reaction vessel, means for feeding a reactant gas to the reaction vessel and discharging the same, discharging electrodes accommodated in the reaction vessel, a source for supplying power for glow discharge to the discharging electrodes, two pairs of solenoid coils disposed on opposite sides of the reaction vessel so that the axes thereof perpendicularly intersect each other as well as perpendicularly the electric field formed between the discharging electrodes, and an AC source for supplying power to the solenoid coils for magnetic field generation, whereby an amorphous (noncrystalline) thin film is formed on a substrate held to intersect perpendicularly the electric field between the discharging electrodes.

In the present invention, the two pairs of solenoid coils are supplied with sinusoidal currents, with phases under control, output from, e.g., a variable phase two-outputs oscillator.

(5) The plasma CVD apparatus of the invention is characterized by comprising a reaction vessel, means for feeding a reactant gas to the reaction vessel and discharging the same, discharging electrodes accommodated in the reaction vessel, a source for supplying power for glow discharge to the discharging electrodes, two solenoid coils so disposed that the magnetic fields they produce perpendicularly intersect each other as well as perpendicularly the electric field that the discharging electrodes form, and an AC source for supplying power to the solenoid coils for magnetic field generation, whereby an amorphous (noncrystalline) thin film is formed on a substrate which is held to intersect perpendicularly the electric field between the discharging electrodes.

In the present invention, the two solenoid coils are supplied with sinusoidal currents, with the phases under control, output from, e.g., a variable phase two-outputs oscillator.

The operation of these inventions will now be explained.

According to the inventions, a resultant magnetic field B formed by two pairs or two pieces of solenoid coils is applied in the direction perpendicularly intersecting an electric field E of discharging electrodes for generating a plasma. Proper control of the phases of the sinusoidal currents being supplied by a variable phase two-outputs oscillator to two pairs or two pieces of solenoid coils causes rotation of the resultant magnetic field B at a constant angular velocity $\omega$, the intensity being constant independently of time. Consequently, the plasma produced between the electrodes is subjected to a force F that rotates at the angular velocity $\omega$ (E.B drift). The plasma is then swung in all directions perpendicularly intersecting the discharge electric field E. Thus the plasma density is equalized in both time and space, leading to a substantial increase in the film-forming area. In addition, the plasma-containment effect of the magnetic field increases the film-forming speed.

Under these inventions the magnetic field between two solenoid coils of a given thickness and a finite length in a pair is uniformly distributed throughout. This provides a relatively large space between the coils for the installation of the reaction vessel and gas inlet-outlet pipings, etc.

The advantageous effects of the inventions are as follows.

As described already, the inventions make it possible to form a large-area amorphous (noncrystalline) thin film at a high speed by applying to a glow discharge plasma a resultant magnetic field that rotates at a constant angular velocity on a plane perpendicularly intersecting a discharge electric field. The inventions are of remarkably great industrial value in the manufacture of amorphous silicon solar batteries, thin film transistors for liquid crystal displays, photoelectronic devices, etc.

BRIEF DESCRIPTION OF THE DRAWINGS

FIG. 2 is a plan view showing the relative position of a reaction vessel and two pairs of solenoid coils in the plasma CVD apparatus of FIG. 1;

FIG. 3 is a perspective view illustrating the relative position of the reaction vessel and two pairs of solenoid coils in the above plasma CVD apparatus;

FIG. 4 is a graph showing the distributions of intensity of magnetic fields between the solenoid coils forming a pair in the above plasma CVD apparatus;

FIG. 5(a) is a view explanatory of a resultant magnetic field formed by two pairs of solenoid coils, and (b) and (c) are graphs explanatory of the magnetic fields formed by two solenoid coils in pairs;

FIG. 12 is a plan view showing the relative position of the reaction vessel and two solenoid coils in the above plasma CVD apparatus;

FIG. 13(a) is a view explanatory of a resultant magnetic field formed by two solenoid coils, and (b) and (c) are graphs explanatory of the magnetic fields formed by two solenoid coils;

FIG. 16 is a graph explanatory of a magnetic field applied in the conventional plasma CVD apparatus.

DETAILED DESCRIPTION OF PREFERRED EMBODIMENTS

By way of exemplification, preferred embodiments of the present invention will be described in detail below in conjunction with the accompanying drawings.

First Embodiment

Figure 1:
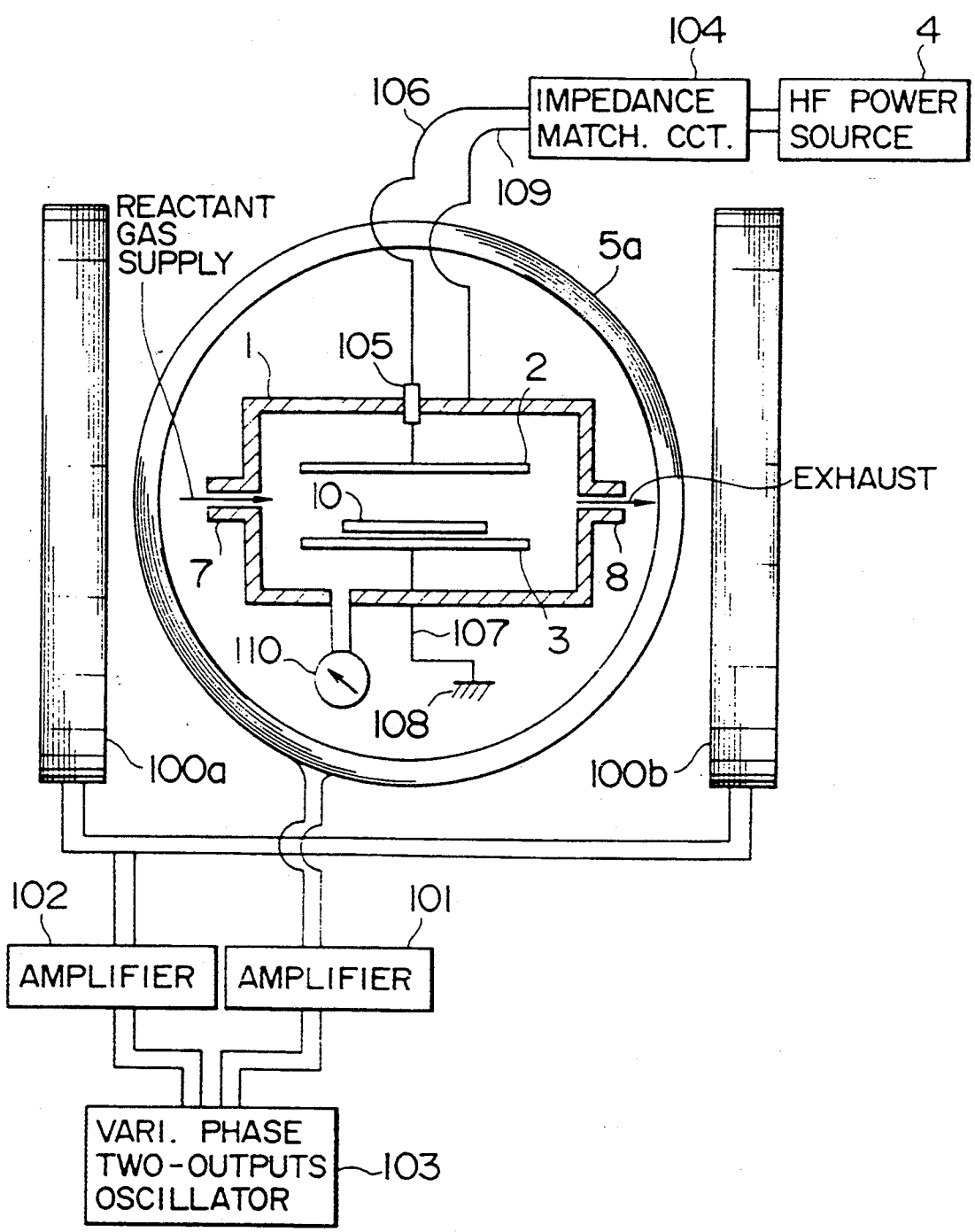
FIG. 1 is a schematic sectional view illustrating the construction of a first embodiment of the plasma CVD apparatus of the present invention.
Figure 14:
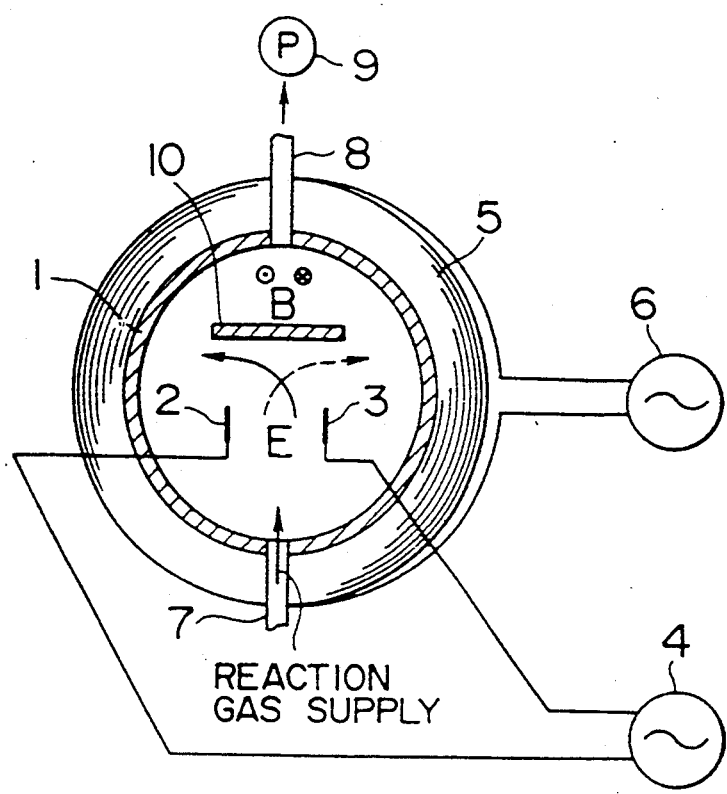
FIG. 14 is a sectional view illustrating the construction of a conventional plasma CVD apparatus.
Figure 15:
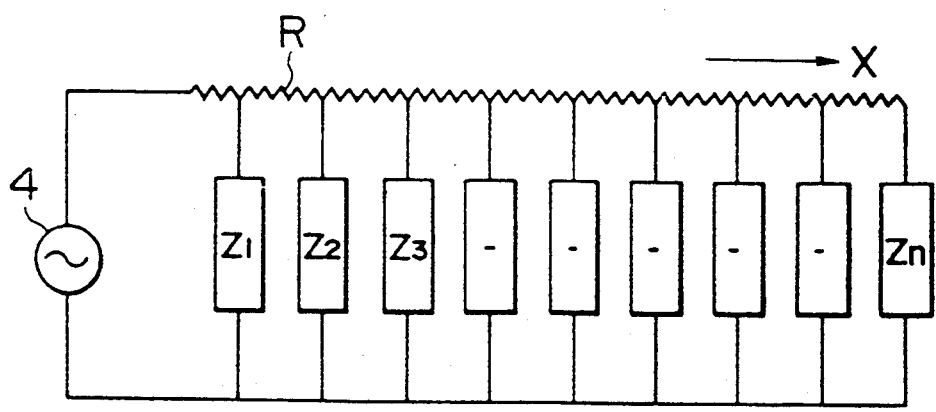
FIG. 15 is a diagram explanatory of a disadvantage of the conventional plasma CVD apparatus.

FIG. 1 is a sectional view illustrating the construction of a first embodiment of the plasma CVD apparatus of the invention, in which parts like the prior art parts shown in FIG. 14 are identified by like numerals.

There are held in a reaction vessel 1 an electrode 2 and a grounded electrode 3 in parallel to produce a glow discharge plasma. The electrode 2 is supplied with electric power, e.g., at a frequency of 13.56 MHz, from a high frequency power source 4 via an impedance matching circuit 104, a first high-frequency cable 106, and a power supply terminal 105. The grounded electrode 3 is connected to an earth 108 through the reaction vessel 1 and a second high-frequency cable 107. The impedance matching circuit 104 has a grounding terminal connected to the reaction vessel 1 by a third high-frequency cable 109.

In the vicinity of the grounded electrode 3, there is held a substrate 10 by a substrate holder not shown, in parallel with the electrodes 2, 3, i.e., perpendicularly intersecting the electric field formed by the two electrodes 2, 3. The reaction vessel 1 is fed with, e.g., monosilane, from a steel cylinder and a flow meter not shown by way of a reactant gas inlet pipe 7. The gas originally present in the reaction vessel 1 is discharged through an evacuation pipe 8 by a vacuum pump not shown. The pressure inside the reaction vessel 1 is measured with a pressure gauge 110.

Around the reaction vessel 1 are located first to fourth solenoid coils 5a, 5b, 100a, 100b having a given thickness and finite length each. As FIGS. 2 and 3 show, the first and second solenoid coils 5a, 5b form a pair as do the third and fourth solenoid coils 100a, 100b. They are arranged so that the axes of the pairs perpendicularly intersect each other, i.e., in the directions of x and y axes, and also perpendicularly intersect the electric field produced by the discharging electrodes.

The first and second solenoid coils 5a, 5b are supplied with sinusoidal power from one output terminal of a variable phase two-outputs oscillator 103 through a first power amplifier 101. The third and fourth solenoid coils 100a, 100b are supplied with sinusoidal power from the other output terminal of the variable phase two-outputs oscillator 103 through a second power amplifier 102. The variable phase two-outputs oscillator 103 is capable of outputting two sine-wave signals with their relative phases shifted and set as desired. The signals are observed through an oscilloscope not shown. As indicated in FIG. 4, the magnetic field that the first and second solenoid coils form has an intensity distribution substantially the same along the axis (in the direction of the x axis). Similarly, the magnetic field formed by the third and fourth solenoid coils 100a, 100b has substantially the same intensity distribution axially (in the direction of the y axis) as in FIG. 4.

A thin film, e.g., of amorphous silicon, is formed using the apparatus described above in the following way. The vacuum pump is driven to evacuate the reaction vessel 1. After the reaction vessel 1 has been thoroughly evacuated (e.g., to $10^{-7}$ Torr), reactant gas, e.g., monosilane gas, is fed through the reactant gas inlet pipe 7 at a flow rate of about 50 to 100 cc/min, maintaining a pressure of 0.05 to 0.5 Torr inside the reaction vessel 1. Supplying power now to the electrodes 2, 3 from the high-frequency source 4 through the impedance matching circuit 104, power supply terminal 105, etc. gives rise to a glow discharge plasma of monosilane between the electrodes 2, 3.

Figure 6:
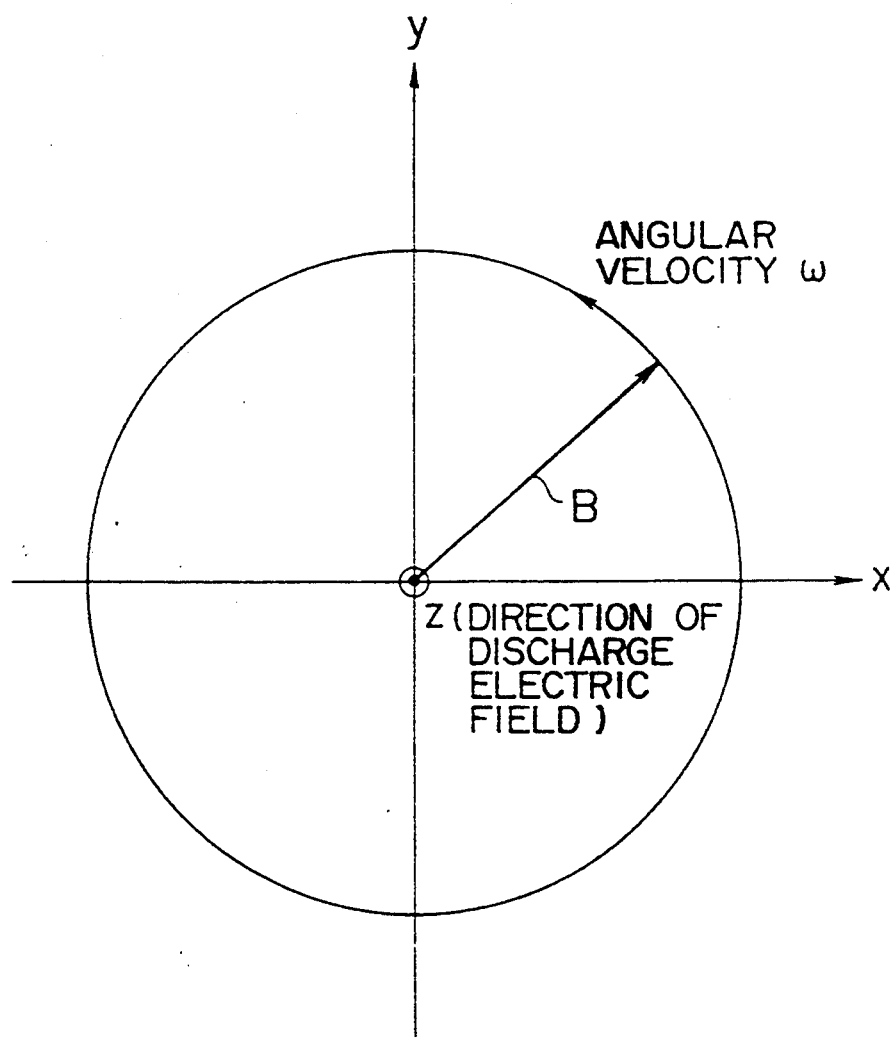
FIG. 6 is a view explanatory of the rotation of a resultant magnetic field formed by two pairs of solenoid coils or by two solenoid coils.
Figure 7:
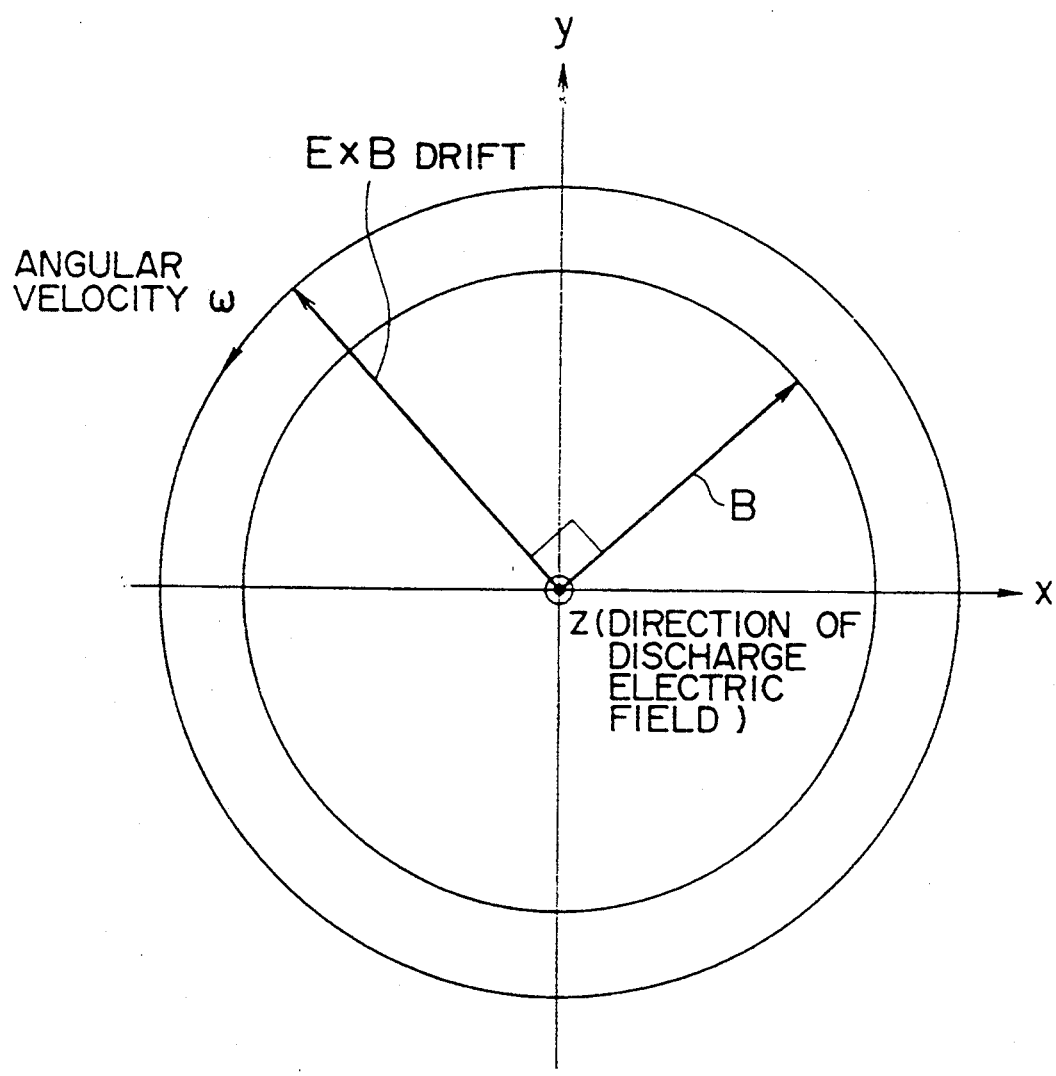
FIG. 7 is a view explanatory of the rotation of an E.B drift that results from the interaction of a resultant magnetic field and a discharge electric field.

Meanwhile, as shown in FIG. 5(b), (c), the two outputs from the variable phase two-outputs oscillator 103 are applied, e.g., as sine-wave power inputs at a frequency of 10 Hz with the phases shifted by 90°, to the first and second solenoid coils 5a, 5b and to the third and fourth solenoid coils 100a, 100b via the first and second power amplifiers 101, 102, respectively. At this time, as indicated at (a) in the same figure, the magnetic field $B_1$ of the first and second solenoid coils 5a, 5b and the magnetic field $B_2$ of the third and fourth solenoid coils 100a, 100b combine to form a resultant magnetic field B. As FIG. 6 shows, this resultant magnetic field B is applied to the glow discharge plasma while rotating at a constant angular velocity of 20 $\pi$ (radians/sec) in the direction perpendicularly intersecting with the electric field E between the electrodes 2, 3. As a consequence, the glow discharge plasma is subjected to a force rotating at a constant angular velocity (E.B drift) as in FIG. 7. The plasma between the electrodes 2, 3 is thus caused to swing in all directions on a plane parallel to the substrate 10. The intensity of the resultant magnetic field B may range from about 40 to about 100 gausses.

The film-thickness distribution and film-forming speed of an amorphous silicon thin film depend on the areas of, and spacing between, the electrodes 2, 3; the flow rate, concentration, and pressure of the reactant gas; the power supplied between the electrodes 2, 3; the intensity of the resultant magnetic field B applied to the glow discharge plasma, etc. In view of this, amorphous silicon thin films were formed under the following conditions. Electrodes measuring 1200 mm by 1200 mm were used together with glass substrates. As a reactant gas, 100% monosilane gas was fed at a flow rate of 100 cc/min. The pressure inside the reaction vessel was set to 0.5 Torr. A high-frequency power of 200 W was applied between the electrodes 2, 3. The intensities of the resultant magnetic fields B applied by the solenoid coils 5a, 5b, 100a, and 100b were set to 0, 20, 40, 60, 80, and 100 gausses.

Figure 8:
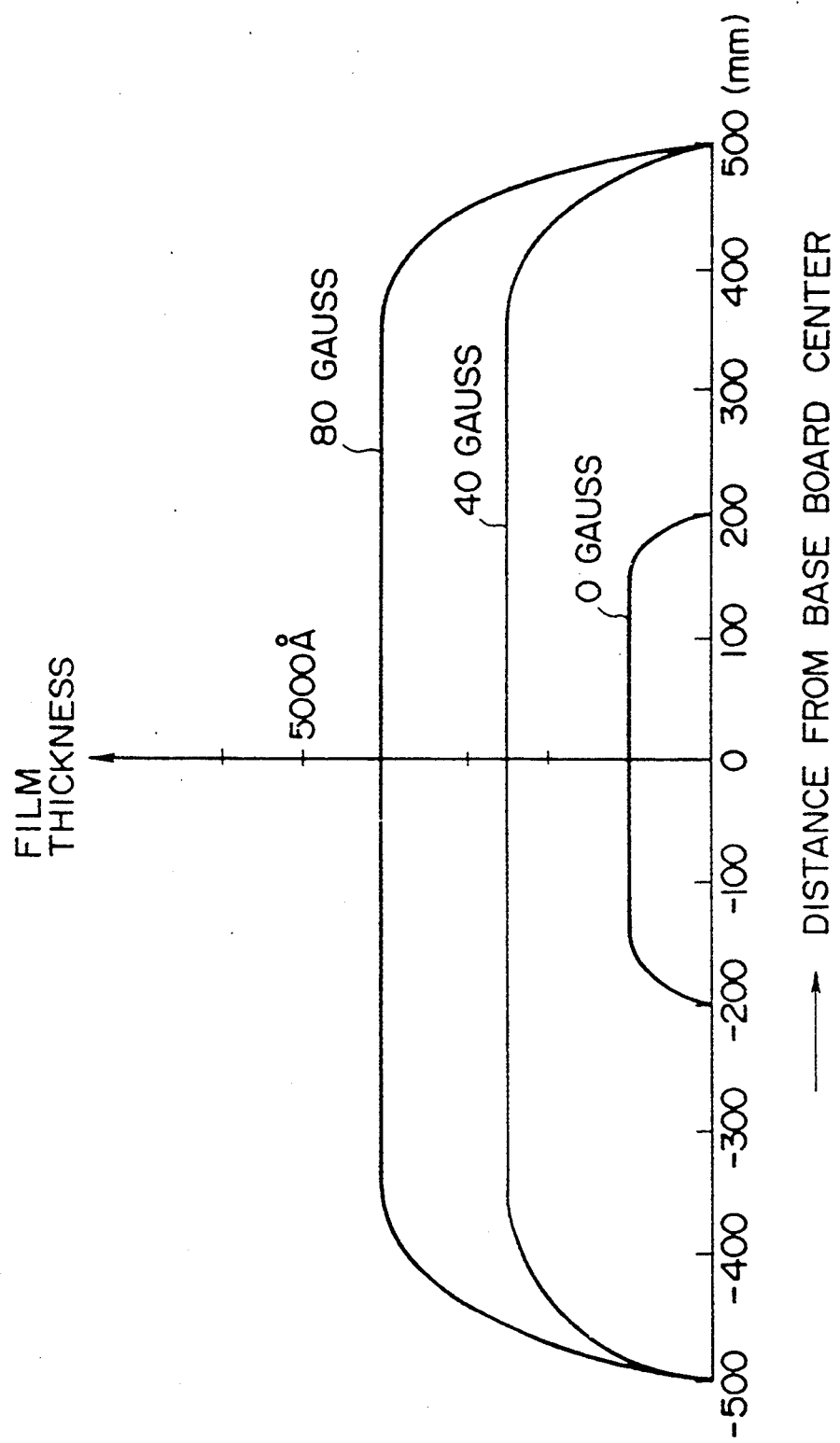
FIG. 8 is a graph showing the thickness distributions of amorphous silicon thin films formed on a substrate (or base board) by the apparatus of the invention.

FIG. 8 represents the film thickness distributions of the amorphous silicon thin films thus formed. It will be seen that the film thickness is even over broad areas when the intensities of the resultant magnetic fields were 40 and 80 gausses, compared with the case when no magnetic field was applied.

Figure 9:
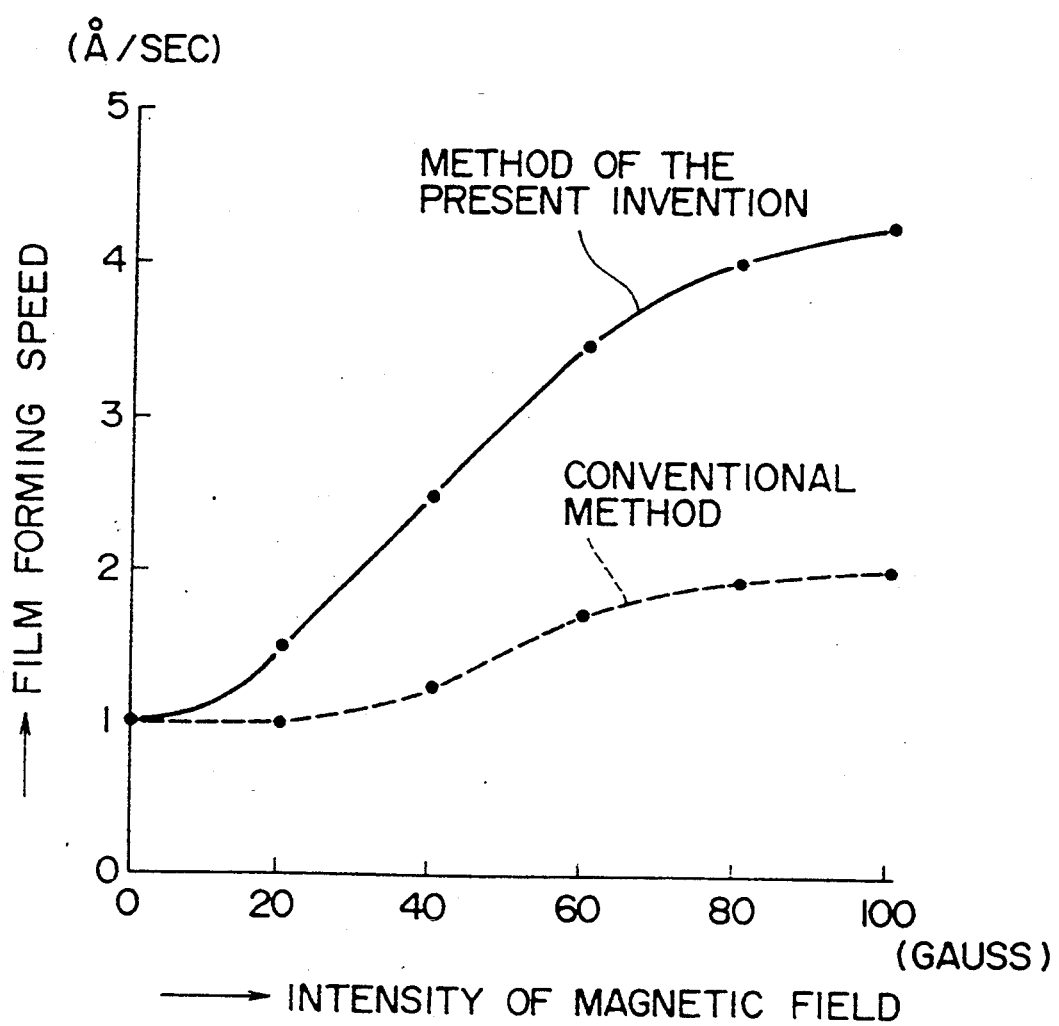
FIG. 9 is a graph showing the relation between the film-forming speed of an amorphous silicon thin film obtained by the apparatus of the invention and the intensity of the magnetic field.

FIG. 9 shows the relation between the intensity of magnetic field and the speed at which an amorphous silicon thin film is formed. It is clear from FIG. 9 that the application of a resultant magnetic field B in accordance with the method of the invention markedly improves the film-forming speed over when no such magnetic field is applied. In a conventional method, by contrast, increasing the intensity of magnetic field with a single coil is not appreciably effective in improving the film-forming speed. For example, the film-forming speed achieved by the conventional method with the application of a magnetic field of 100 gausses is about 2 Å/sec, whereas the speed is remarkably increased to 4 Å/sec by the method of the invention.

Second Embodiment

The second embodiment of the present invention will now be described in detail in connection with the accompanying drawings.

Figure 10:
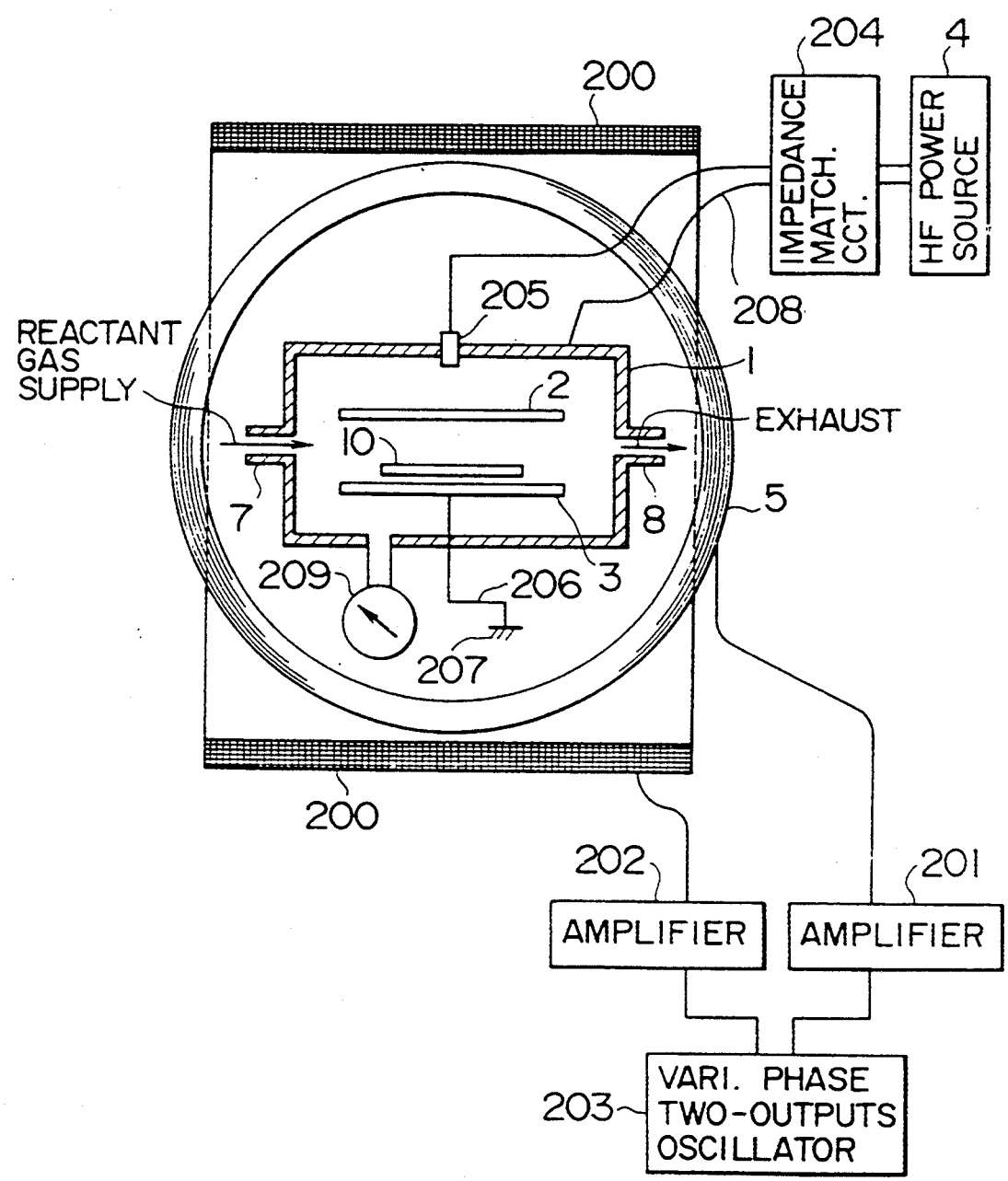
FIG. 10 is a schematic sectional view illustrating the construction of a second embodiment of the plasma CVD apparatus of the present invention.

FIG. 10 is a sectional view illustrating the construction of a second embodiment of the plasma CVD apparatus of the invention, in which parts like the prior art parts shown in FIG. 14 are identified by like numerals.

There are held in a reaction vessel 1 electrodes 2, 3 for producing a glow discharge plasma. The electrode 2 is supplied with electric power, e.g., at a frequency of 13.56 MHz, from a high frequency power source 4 via an impedance matching circuit 204 and a power supply terminal 205. The electrode 3 is connected to an earth 207 through the reaction vessel 1 and a high-frequency cable 206. The impedance matching circuit 204 has a grounding terminal connected to the reaction vessel 1 by a high-frequency cable 208. There is held a substrate 10 by a substrate holder not shown, in parallel with the electrodes 2, 3, i.e., perpendicularly intersecting the electric field formed by the two electrodes 2, 3. The reaction vessel 1 is fed with a reactant gas, e.g., monosilane, from a steel cylinder not shown by way of a reactant gas inlet pipe 7. The gas originally present in the reaction vessel 1 is discharged through an evacuation pipe 8 by a vacuum pump not shown. The pressure inside the reaction vessel 1 is measured with a pressure gauge 209.

Figure 11:
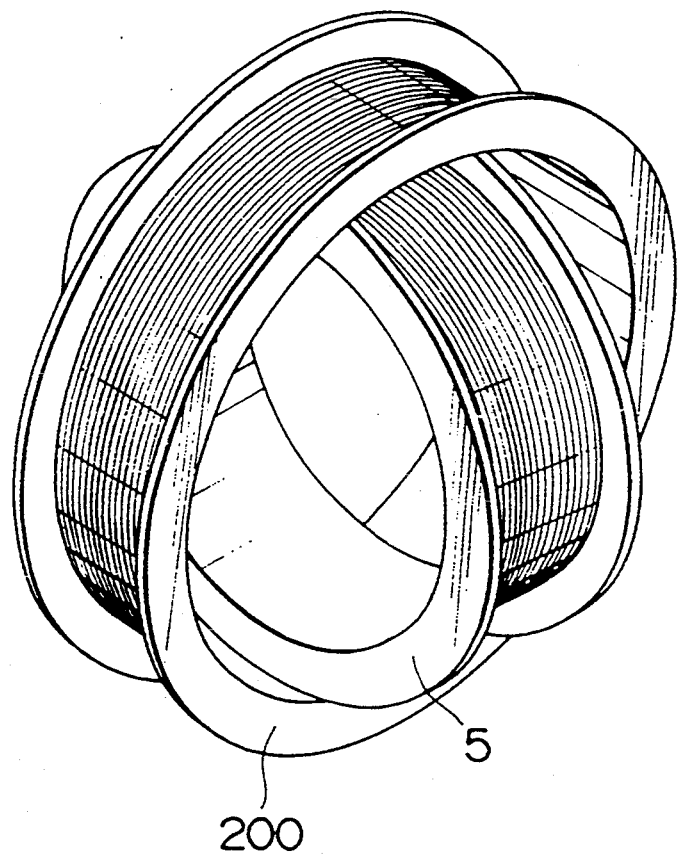
FIG. 11 is a perspective view of two solenoid coils used in the above plasma CVD apparatus.

Around the reaction vessel 1 are located a first solenoid coil 5 and a second solenoid coil 200. As FIG. 11 shows, the first solenoid coil 5 and the second solenoid coil 200 are perpendicularly arranged each other so that the magnetic fields $B_1$ and $B_2$ they form respectively intersect perpendicularly the electric field produced by the electrodes 2, 3. The reaction vessel 1, the first solenoid coil 5, and the second solenoid coil 200 are set in relative position as shown in FIG. 12. The first and second solenoid coils 5, 200 are supplied with sinusoidal power from a variable phase two-outputs oscillator 203 through a first power amplifier 201 and a second power amplifier 202, respectively. The variable phase two-outputs oscillator 203 is capable of outputting two sine-wave signals with their relative phases shifted and set as desired. The signals are observed through an oscilloscope not shown.

A thin film, e.g., of amorphous silicon, is formed using the apparatus described above in the following way. The vacuum pump is driven to evacuate the reaction vessel 1. While being fed, e.g., with monosilane gas, through the reactant gas inlet pipe 7 at a flow rate of about 50 to 100 cc/min, the reaction vessel 1 is kept at an internal pressure of 0.05 to 0.5 Torr. Supplying power now to the electrodes 2, 3 from the high-frequency source 4 through the impedance matching circuit 204, power supply terminal 205, etc. gives rise to a glow discharge plasma of monosilane between the electrodes 2, 3.

Meanwhile, as shown in FIG. 13(b), (c), the variable phase two-outputs oscillator 203 supplies sine-wave power outputs, e.g., at a frequency of 10 Hz with the phases shifted by 90°, to the first and second solenoid coils 5, 200 via the first and second power amplifiers 201, 202, respectively. At this time, as indicated at (a) in the same figure, the magnetic fields $B_1$, $B_2$ of the first and second solenoid coils 5, 200 combine to form a resultant magnetic field B. As FIG. 6 shows, this resultant magnetic field B is applied to the glow discharge plasma while rotating at a constant angular velocity of $20\pi$ (radians/sec) in the direction perpendicularly intersecting with the electric field E between the electrodes 2, 3. As a consequence, the glow discharge plasma is subjected to a force rotating at a constant angular velocity (E.B drift) as in FIG. 7. The plasma between the electrodes 2, 3 is thus caused to swing in parallel with the electrode 2 and in all directions. The intensity of the resultant magnetic field B may range from about 40 to about 100 gausses.

The film-thickness distribution and film-forming speed of an amorphous silicon thin film depend on the flow rate and pressure of the reactant gas; the power supplied between the electrodes; the intensity of the resultant magnetic field applied to the glow discharge plasma, etc. In view of this, amorphous silicon thin films were formed under the following conditions. Electrodes measuring having an 1000 mm diameter and glass substrates were used. As a reactant gas, 100% monosilane gas was fed at a flow rate of 100 cc/min. The pressure inside the reaction vessel was set to 0.5 Torr. A high-frequency power of 200 W was applied between the electrodes 2, 3. The resultant magnetic fields B applied by the solenoid coils 5, 200 was set to intensities of 0, 20, 40, 60, 80, and 100 gausses.

FIG. 8 represents the film thickness distributions of the amorphous silicon thin films thus formed. It will be seen that the film thickness is even over broad areas when the intensities of the resultant magnetic field B were 40 and 80 gausses, compared with the case when no magnetic field was applied.

FIG. 9 shows the relation between the intensity of magnetic field and the speed at which an amorphous silicon thin film is formed. It is clear from FIG. 9 that the application of a resultant magnetic field B in accordance with the method of the invention markedly improves the film-forming speed over when no such magnetic field is applied. In a conventional method, by contrast, increasing the intensity of magnetic field with a single coil is not appreciably effective in improving the film-forming speed.

We claim:

1. A plasma CVD apparatus comprising a reaction vessel, means for feeding a reactant gas to the reaction vessel and discharging said reactant gas from said vessel, discharging electrodes disposed in the reaction vessel, and a source for supplying power for glow discharge to the discharging electrodes thereby forming an amorphous (noncrystalline) thin film on a surface of a substrate held within the reaction vessel, wherein said substrate surface perpendicularly intersects an electric field formed between the discharging electrodes, said apparatus further comprising two solenoid coils at least partially overlapping each other, each coil having an axis so disposed that said coil axes perpendicularly intersect each other and perpendicularly intersect the electric field between the discharging electrodes, and an AC source for supplying electric currents to the solenoid coils for magnetic field generation, said electric currents having a 90° phase difference, whereby a rotating resultant magnetic field is applied which rotates at a constant angular velocity.

2. A plasma CVD apparatus, as claimed in claim 1, wherein the intensity of said rotating resultant magnetic field in the center of said two solenoid coils is from about 40 to about 100 gauss.

* * * * *